(12) United States Patent
Zhang

(10) Patent No.: US 11,322,718 B2
(45) Date of Patent: May 3, 2022

(54) FLEXIBLE DISPLAY PANEL AND PREPARATION METHOD

(71) Applicant: WUHAN CHINA STAR OPTOELECTRONICS SEMICONDUCTOR DISPLAY TECHNOLOGY CO., LTD., Wuhan (CN)

(72) Inventor: Fuyang Zhang, Wuhan (CN)

(73) Assignee: WUHAN CHINA STAR OPTOELECTRONICS SEMICONDUCTOR DISPLAY TECHNOLOGY CO., LTD., Wuhan (CN)

(*) Notice: Subject to any disclaimer, the term of this patent is extended or adjusted under 35 U.S.C. 154(b) by 502 days.

(21) Appl. No.: 16/336,833

(22) PCT Filed: Nov. 1, 2018

(86) PCT No.: PCT/CN2018/113288
§ 371 (c)(1),
(2) Date: Mar. 26, 2019

(87) PCT Pub. No.: WO2020/056867
PCT Pub. Date: Mar. 26, 2020

(65) Prior Publication Data
US 2021/0359254 A1   Nov. 18, 2021

(30) Foreign Application Priority Data
Sep. 20, 2018 (CN) .......................... 201811116820.1

(51) Int. Cl.
*H01L 51/52* (2006.01)
*H01L 27/32* (2006.01)
*H01L 51/56* (2006.01)

(52) U.S. Cl.
CPC ...... *H01L 51/5253* (2013.01); *H01L 27/3244* (2013.01); *H01L 51/56* (2013.01); *H01L 2227/323* (2013.01); *H01L 2251/5338* (2013.01)

(58) Field of Classification Search
None
See application file for complete search history.

(56) References Cited

U.S. PATENT DOCUMENTS

2017/0155082 A1* 6/2017 Mu .................... H01L 51/5293
2018/0036999 A1* 2/2018 Tokinoya .............. B32B 27/306
(Continued)

FOREIGN PATENT DOCUMENTS

CN  106158740 A  11/2016
CN  106469738 A  3/2017
(Continued)

OTHER PUBLICATIONS

Dennenwaldt, Teresa, et al. "Bonding Behavior and Chemical Stability of Silica-Based Nanotubes and Their 3d Assembly." The Journal of Physical Chemistry C, vol. 118, No. 16, 2014, pp. 8416-8423., doi:10.1021/jp500408x. (Year: 2014).*

*Primary Examiner* — J. E. Schoenholtz
(74) *Attorney, Agent, or Firm* — Osha Bergman Watanabe & Burton LLP

(57) ABSTRACT

A flexible display panel includes: a first organic layer; a blocking layer disposed on the first organic layer; and a first adhesion enhancing layer disposed between the first organic layer and the blocking layer.

17 Claims, 2 Drawing Sheets

(56) References Cited

U.S. PATENT DOCUMENTS

| | | | |
|---|---|---|---|
| 2018/0366662 A1* | 12/2018 | Sano | ................ B32B 3/26 |
| 2019/0027458 A1 | 1/2019 | Wang et al. | |
| 2019/0131552 A1 | 5/2019 | Xie et al. | |
| 2020/0028123 A1* | 1/2020 | Xie | ............... H01L 51/003 |
| 2021/0098502 A1* | 4/2021 | Kawanago | ........... H01L 51/003 |

FOREIGN PATENT DOCUMENTS

| | | |
|---|---|---|
| CN | 107768414 A | 3/2018 |
| CN | 108123044 A | 6/2018 |
| KR | 20170119569 A | 10/2017 |

* cited by examiner

FLEXIBLE DISPLAY PANEL AND PREPARATION METHOD

CROSS REFERENCE TO RELATED APPLICATIONS

This application is a U.S. National Phase application submitted under 35 U.S.C. § 371 of Patent Cooperation Treaty Application serial No. PCT/CN2018/113288, filed Nov. 1, 2018, which claims the priority of China Patent Application serial No. 201811116820.1, filed Sep. 20, 2018, the disclosures of which are incorporated herein by reference in their entirety.

BACKGROUND OF DISCLOSURE

1. Field of Disclosure

The invention relates to the field of display technology, and more particularly, to a flexible display panel and its preparing method.

2. Description of Related Art

Flexible substrates, which are key components in flexible display devices, are used as supporting and protecting assemblies for the whole flexible devices. Not only do flexible substrates affect the quality of display devices significantly, but they relate to lifetimes of the devices directly. For flexible devices, main performance requirements for substrate materials are heat resistance, stability of size at a high temperature, flexibility, blocking water and oxygen properties, and surface planarization, etc. For now, ultra-thin glasses and polymer thin films are normally used as substrate materials. Compared with glass substrates, polymer thin-film substrates have more superior optical, mechanical, and chemical performances, but have shortages of stability of size at a high temperature and abilities of blocking water and oxygen.

In general, conventional flexible substrates use two-layer polymer thin films and inorganic blocking layers disposed between two polymer thin films to block water and oxygen, so that the upper display devices are prevented from the erosion by water and oxygen. However, the process of manufacturing display devices on flexible substrates is required to proceed at a high temperature. Because thermal expansion coefficients of film layers of a flexible substrate are different, stresses are concentrated on interfaces between a polymer thin film and a blocking layer, causing film layers to break or peel. In addition, polymer thin films are also easy to peel from a blocking layer while a flexible substrate is in a bending process.

In conclusion, there exists problems of easily peeling between a polymer thin film and an inorganic blocking layer in conventional flexible substrates.

SUMMARY

The invention provides a flexible display panel to solve the problems of stability of flexible substrates and lifetimes for conventional flexible display panels, that is, greater differences in thermal expansion coefficients between film layers due to a high temperature environment cause stresses to be concentrated on interfaces between film layers, and thus film layers break or peel.

The technical solution for solving the problems above is described as follows:

A flexible display panel, provided in the invention, includes: a first organic layer; a blocking layer formed on the first organic layer; and a first adhesion enhancing layer formed between the first organic layer and the blocking layer, wherein the first adhesion enhancing layer is prepared from silica nanotubes which are distributed on a first surface of the first organic layer, and wherein the ratio of the area, where the silica nanotubes contact the first organic layer, to the area of the first surface is between 10% and 80%.

In at least one embodiment of the invention, the flexible display panel further includes a second organic layer formed on the blocking layer.

In at least one embodiment of the invention, the flexible display panel further includes a TFT device, an emission layer of OLED and a thin film encapsulation layer which are disposed on the second organic layer in sequence.

In at least one embodiment of the invention, the flexible display panel further includes a second adhesion enhancing layer formed between the blocking layer and the second organic layer.

In at least one embodiment of the invention, the first organic layer and the second organic layer are prepared from at least one material selected from the group consisting of polyimide, polyetherimide, polyphenylene sulfide, and polyarylate.

A flexible display panel, further provided in the invention, includes: a first organic layer; a blocking layer formed on the first organic layer; and a first adhesion enhancing layer formed between the first organic layer and the blocking layer.

In at least one embodiment of the invention, the flexible display panel further includes a second organic layer formed on the blocking layer.

In at least one embodiment of the invention, the flexible display panel further includes a TFT device, an emission layer of OLED and a thin film encapsulation layer which are disposed on the second organic layer in sequence.

In at least one embodiment of the invention, the flexible display panel further includes a second adhesion enhancing layer formed between the blocking layer and the second organic layer.

In at least one embodiment of the invention, at least one of the first adhesion enhancing layer and the second adhesion enhancing layer is prepared from silica nanotubes.

In at least one embodiment of the invention, the first organic layer and the second organic layer are prepared from at least one material selected from the group consisting of polyimide, polyetherimide, polyphenylene sulfide, and polyarylate.

In at least one embodiment of the invention, a thickness of the first organic layer and a thickness of the second organic layer are both between 20 micrometers and 500 micrometers.

In at least one embodiment of the invention, the first organic layer is prepared from polyimide, and the thickness of the first organic layer is 100 micrometers.

In at least one embodiment of the invention, the blocking layer is prepared from at least one material selected from the group consisting of silicon dioxide, amorphous silicon, and silicon nitride.

In at least one embodiment of the invention, a thickness of the blocking layer is between 100 nanometers and 2000 nanometers.

In at least one embodiment of the invention, the blocking layer is prepared from silicon dioxide, and the thickness of the blocking layer is 500 nanometers.

A method of preparing a flexible display panel, further provided in the invention, includes:

(S10) forming a wet film through coating an organic fluid on a rigid substrate;

(S20) forming a first adhesion enhancing layer on the surface of the wet film;

(S30) curing the wet film having the first adhesion enhancing layer coated thereon, so that the cured wet film becomes a first organic layer;

(S40) forming a blocking layer on the surface of the first adhesion enhancing layer;

(S50) forming a second adhesion enhancing layer on the surface of the blocking layer;

(S60) forming a second organic layer on the second adhesion enhancing layer;

(S70) forming a TFT device, an emission layer of OLED and a thin film encapsulation layer on the second organic layer in sequence; and (S80) removing the rigid substrate.

In at least one embodiment of the invention, at least one of the first adhesion enhancing layer and the second adhesion enhancing layer is prepared from silica nanotubes.

In at least one embodiment of the invention, the blocking layer is prepared from at least one material selected from the group consisting of silicon dioxide, amorphous silicon, and silicon nitride.

In at least one embodiment of the invention, the first organic layer and the second organic layer are prepared from at least one material selected from the group consisting of polyimide, polyetherimide, polyphenylene sulfide, and polyarylate.

The benefit of the invention is that a flexible display panel and its preparing method, provided in the invention, enhance adhesion between film layers of a flexible substrate through configuring an adhesion enhancing layer, so that stability and lifetimes of flexible display panels while being in use are improved.

BRIEF DESCRIPTION OF DRAWINGS

In order to more clearly illustrate the embodiments of the invention or technical solutions in current technologies, the drawings required for describing of the embodiments or current technologies will be briefly introduced below. It is obvious that the following drawings are merely some embodiments of the invention, a person having ordinary skill in this field can obtain other drawings according to these drawings under the premise of not paying creative works.

DETAILED DESCRIPTION OF EMBODIMENTS

The following embodiments are described with reference to the accompanying drawings, which exemplify the realization of the invention. The directional terminologies of the invention, such as "top", "bottom", "front", "back", "left", "right", "inner", "outer", "side" and the like are merely the directions with reference to the accompanying drawings. Therefore, the aforesaid directional terminologies are used to describe and comprehend the invention without limiting the invention. In the following drawings, the units having similar structures are marked by same numerals.

The embodiments of the invention can solve deficiencies of stability and lifetimes for conventional flexible display panels, that is, when flexible substrates are in a high temperature environment, there are greater differences in thermal expansion coefficients between film layers, causing stresses to be concentrated on interfaces between film layers, and thus causing film layers to break or peel.

Figure 1:
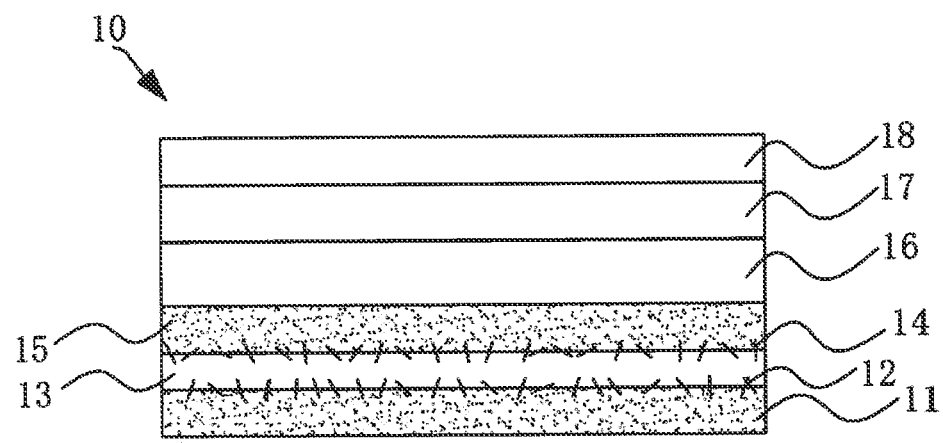
FIG. 1 is a schematic diagram of an integral structure of a flexible display panel according to one embodiment of the present invention.

As shown in FIG. 1, the flexible display panel 10 provided in the embodiment includes: a first organic layer 11, a first adhesion enhancing layer 12, a blocking layer 13, a second adhesion enhancing layer 14, a second organic layer 15, a thin-film transistor (TFT) device 16, an emission layer 17 of organic light-emitting diode (OLED), and a thin film encapsulation layer 18.

Figure 2:
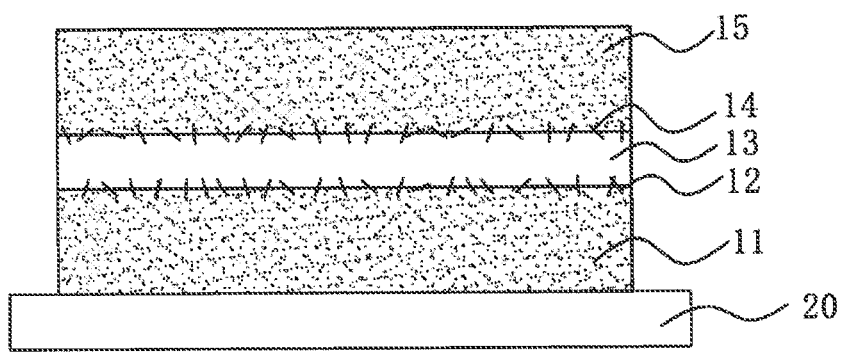
FIG. 2 is another schematic structural diagram of a flexible display panel according to one embodiment of the present invention.

As shown in FIG. 2, the first organic layer 11 is disposed on a rigid substrate 20 used as a substrate. After subsequent light-emitting devices of display panels are prepared, the rigid substrate 20 is peeled from the flexible substrate. In the embodiment, the rigid substrate 20 is a glass substrate or can be made of other materials.

The first adhesion enhancing layer 12 is disposed between the first organic layer 11 and the blocking layer 13, and connects the first organic layer 11 and the blocking layer 13. The first adhesion enhancing layer 12 is used to enhance adhesion between it and the blocking layer 13. On the one hand, the first organic layer 11 is prevented from peeling from the blocking layer 13 due to the effects of stresses while the flexible display panel 10 is bending for daily use; on the other hand, while preparing the TFT device 16 on the second organic layer 15 at a working temperature as high as 300 degrees centigrade to 500 degrees centigrade, sizes of film layers change too much due to greater differences in thermal expansion coefficients between the first organic layer 11 and the blocking layer 13 at a high temperature, and thus inner stresses occur in the interfaces between film layers, resulting in the peeling between film layers while film layers are bending. Stresses on the interface between two film layers can be balanced through adding the first adhesion enhancing layer 12 between two film layers, and thus the stability of the flexible substrate at a high temperature is improved.

In order to enhance the reliability of flexible substrates, in addition to disposing the blocking layer 13 for blocking invasions of water and oxygen, two organic layers are also disposed. In the embodiment, the second organic layer 15 is disposed on the blocking layer 13. Also, in order to prevent the blocking layer 13 from peeling from the second organic layer 15, the second adhesion enhancing layer 14 is disposed between the blocking layer 13 and the second organic layer 15.

The first adhesion enhancing layer 12 and the second adhesion enhancing layer 14 are prepared from silica nanotubes. Silica nanotubes can enhance adhesion between film layers at a high temperature because of their advantages of high strength, high flexibility, and high stability. Other materials having the same effects and similar sizes can also be used.

Figure 3:
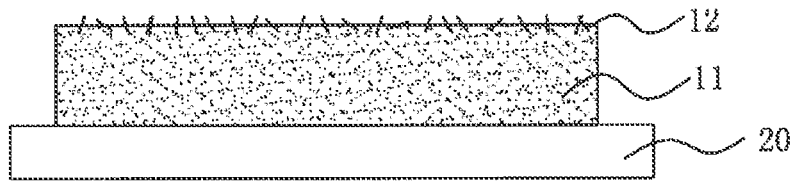
FIG. 3 is another schematic structural diagram of a flexible display panel according to one embodiment of the present invention.

As shown in FIG. 3, silica nanotubes are prepared and largely uniformly distributed on a first surface of the first organic layer 11, wherein the first surface is far from one side of the rigid substrate 20. The ratio of the area, where the silica nanotubes are distributed, to the area of the first surface is between 10% and 80%.

The first organic layer 11 and the second organic layer 15 are prepared from one or more materials selected from the group consisting of polyimide, polyetherimide, polyphenylene sulfide, and polyarylate. A thickness of the first organic layer 11 and a thickness of the second organic layer 15 are both between 20 micrometers and 500 micrometers. In the embodiment, the first organic layer 11 and the second organic layer 15 are both prepared from polyimide, and their thickness are both 100 micrometers.

The blocking layer 13 is prepared from one or more materials selected from the group consisting of silicon dioxide, amorphous silicon, and silicon nitride. A thickness of the blocking layer is between 100 nanometers and 2000 nanometers. In the embodiment, the blocking layer 13 is prepared from silicon dioxide, and its thickness is 500 nanometers.

Figure 4:
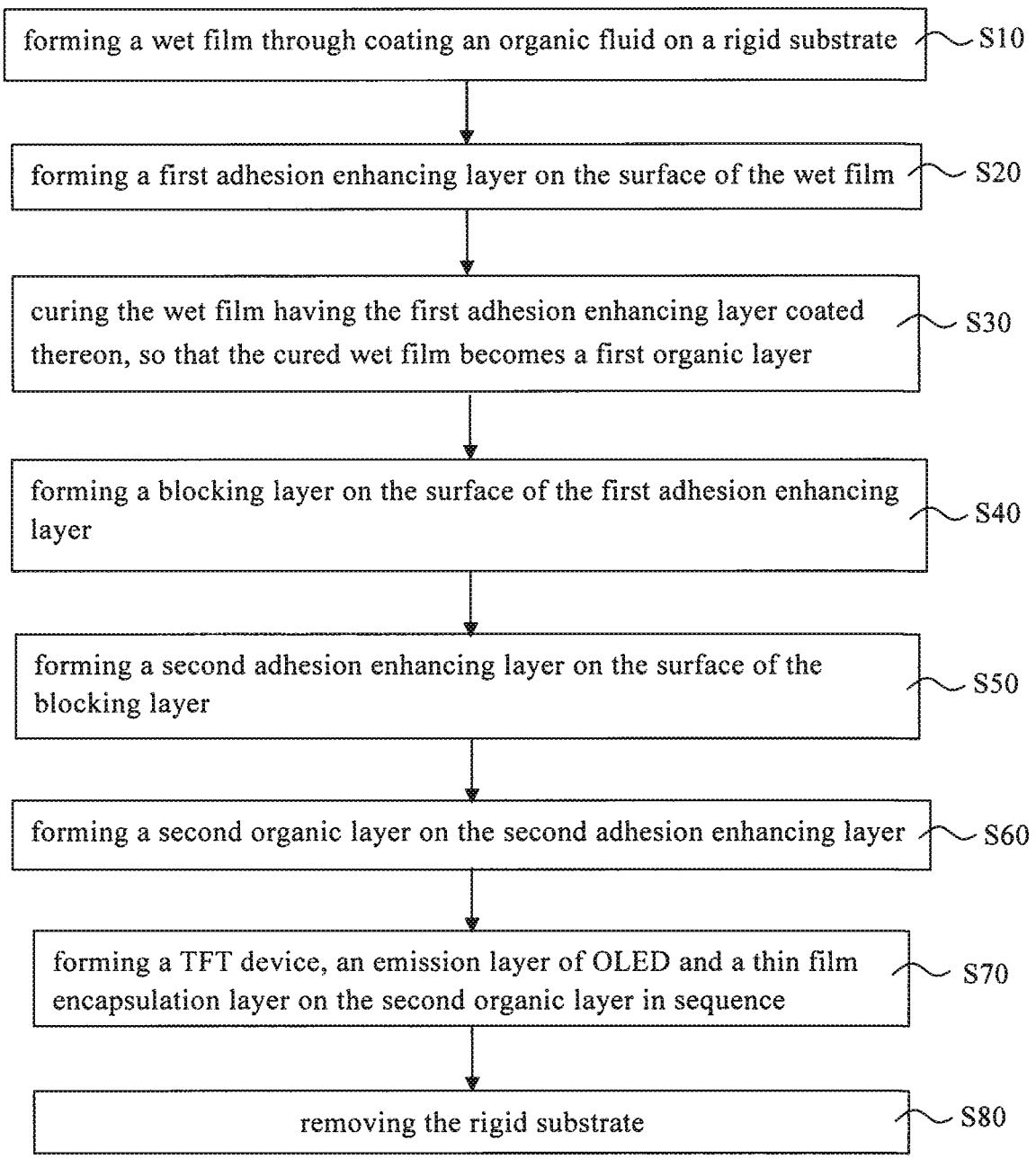
FIG. 4 is a flow chart showing a method of preparing the flexible display panel of the present invention.

As shown in FIG. 4, the method of preparing a flexible display panel further provided in the invention includes:

(S10) forming a wet film through coating an organic fluid on a rigid substrate;

(S20) forming a first adhesion enhancing layer on the surface of the wet film;

(S30) curing the wet film having the first adhesion enhancing layer coated thereon, so that the cured wet film becomes a first organic layer;

(S40) forming a blocking layer on the surface of the first adhesion enhancing layer;

(S50) forming a second adhesion enhancing layer on the surface of the blocking layer;

(S60) forming a second organic layer on the second adhesion enhancing layer;

(S70) forming a TFT device, an emission layer of OLED and a thin film encapsulation layer on the second organic layer in sequence; and (S80) removing the rigid substrate.

The preparation method will be explained in detail below.

In step S10, forming a polyimide wet film with a thickness of 100 micrometers through coating a polyimide fluid on a rigid substrate that can be a glass substrate.

In step S20, silica nanotubes are formed and relatively evenly distributed on the surface of the polyimide wet film, and then a first adhesion enhancing layer is formed. The ratio of the area, where the silica nanotubes are distributed, to the area of the surface of the polyimide wet film is between 10% and 80%.

In step S30, curing the wet film having the first adhesion enhancing layer coated thereon, so that the polyimide wet film is cured and then a first organic layer is formed.

In step S40, depositing a silica film layer with a thickness of 500 nanometers on the first adhesion enhancing layer by a Plasma Enhanced Chemical Vapor Deposition method, so that a blocking layer is formed.

In step S50, silica nanotubes are formed and relatively evenly distributed on the surface of the blocking layer, and then a second adhesion enhancing layer is formed. The ratio of the area, where the silica nanotubes are distributed, to the area of the surface of the blocking layer is between 10% and 80%.

In step S60, forming a second organic layer with a thickness of 100 micrometers through coating a polyimide fluid on the surface of the second adhesion enhancing layer and then curing the polyimide fluid.

In step S70, the TFT device includes an active layer, a gate insulating layer, a gate electrode, a source electrode and a drain electrode. The emission layer of LED includes an anode, a light-emitting material layer and a cathode. The thin film encapsulation layer is a composite structure of organic layers and inorganic layers which overlap each other.

In step S80, removing the rigid substrate from the flexible display panel after finishing the preparation of the flexible display panel.

Wherein, polyimide fluid can be replaced by one or more materials selected from the group consisting of polyetherimide, polyphenylene sulfide, and polyarylate. Thicknesses of coating film layers, depending on the selected materials, are between 20 micrometers and 500 micrometers.

In addition to silicon dioxide, the blocking layer may also be prepared from one or more materials selected from the group consisting of amorphous silicon and silicon nitride. A thickness of the blocking layer is between 100 nanometers and 2000 nanometers.

The benefit of the invention is that a flexible display panel and its preparing method, provided in the invention, enhance adhesion between film layers of a flexible substrate through configuring an adhesion enhancing layer, so that stability and lifetimes of flexible display panels while being in use are improved.

In conclusion, although the present invention has been described with reference to the foregoing preferred embodiments thereof, it is not limited to the foregoing preferred embodiments. It is apparent to those skilled in the art that a variety of modifications and changes may be made without departing from the scope of the present invention which is intended to be defined by the appended claims.

What is claimed is:

1. A flexible display panel, comprising:
   a first organic layer;
   a blocking layer formed on the first organic layer; and
   a first adhesion enhancing layer formed between the first organic layer and the blocking layer,
   wherein the first adhesion enhancing layer is prepared from silica nanotubes which are distributed on a first surface of the first organic layer, and
   wherein a ratio of an area, where the silica nanotubes contact the first organic layer, to an area of the first surface is between 10% and 80%.

2. The flexible display panel of claim 1, further comprising a second organic layer formed on the blocking layer.

3. The flexible display panel of claim 2, further comprising a thin-film transistor (TFT) device, an emission layer of organic light-emitting diode (OLED) and a thin film encapsulation layer which are disposed on the second organic layer in sequence.

4. The flexible display panel of claim 2, further comprising a second adhesion enhancing layer formed between the blocking layer and the second organic layer.

5. The flexible display panel of claim 2, wherein the first organic layer and the second organic layer are prepared from at least one material selected from the group consisting of polyimide, polyetherimide, polyphenylene sulfide, and polyarylate.

6. A flexible display panel, comprising:
   a first organic layer;
   a blocking layer formed on the first organic layer;
   a first adhesion enhancing layer formed between the first organic layer and the blocking layer
   a second organic layer formed on the blocking layer; and
   a second adhesion enhancing layer formed between the blocking layer and the second organic layer,
   wherein at least one of the first adhesion enhancing layer and the second adhesion enhancing layer is prepared from silica nanotubes.

7. The flexible display panel of claim 6, further comprising a thin-film transistor (TFT) device, an emission layer of organic light-emitting diode (OLED) and a thin film encapsulation layer which are disposed on the second organic layer in sequence.

8. The flexible display panel of claim 6, wherein the first organic layer and the second organic layer are prepared from at least one material selected from the group consisting of polyimide, polyetherimide, polyphenylene sulfide, and polyarylate.

9. The flexible display panel of claim 8, wherein a thickness of the first organic layer and a thickness of the second organic layer are both between 20 micrometers and 500 micrometers.

10. The flexible display panel of claim 9, wherein the first organic layer is prepared from polyimide, and the thickness of the first organic layer is 100 micrometers.

11. The flexible display panel of claim 6, wherein the blocking layer is prepared from at least one material selected from the group consisting of silicon dioxide, amorphous silicon, and silicon nitride.

12. The flexible display panel of claim 11, wherein the thickness of the blocking layer is between 100 nanometers and 2000 nanometers.

13. The flexible display panel of claim 12, wherein the blocking layer is prepared from silicon dioxide, and the thickness of the blocking layer is 500 nanometers.

14. A method of preparing a flexible display panel, comprising:
   (S10) forming a wet film through coating an organic fluid on a rigid substrate;
   (S20) forming a first adhesion enhancing layer on the surface of the wet film;
   (S30) curing the wet film having the first adhesion enhancing layer coated thereon, so that the cured wet film becomes a first organic layer;
   (S40) forming a blocking layer on the surface of the first adhesion enhancing layer;
   (S50) forming a second adhesion enhancing layer on the surface of the blocking layer;
   (S60) forming a second organic layer on the second adhesion enhancing layer;
   (S70) forming a thin-film transistor (TFT) device, an emission layer of organic light-emitting diode (OLED) and a thin film encapsulation layer on the second organic layer in order; and
   (S80) removing the rigid substrate.

15. The method of claim 14, wherein at least one of the first adhesion enhancing layer and the second adhesion enhancing layer is prepared from silica nanotubes.

16. The method of claim 14, wherein the blocking layer is prepared from at least one material selected from the group consisting of silicon dioxide, amorphous silicon, and silicon nitride.

17. The method of claim 14, wherein the first organic layer and the second organic layer are prepared from at least one material selected from the group consisting of polyimide, polyetherimide, polyphenylene sulfide, and polyarylate.

* * * * *